(12) United States Patent
Peake (10) Patent No.: US 7,642,596 B2
(45) Date of Patent: Jan. 5, 2010

(54) INSULATED GATE FIELD EFFECT TRANSISTOR

(75) Inventor: Steven T. Peake, Warrington (GB)

(73) Assignee: NXP B.V., Eindhoven (NL)

( * ) Notice: Subject to any disclaimer, the term of this patent is extended or adjusted under 35 U.S.C. 154(b) by 242 days.

(21) Appl. No.: 10/578,286

(22) PCT Filed: Nov. 3, 2004

(86) PCT No.: PCT/IB2004/052284

§ 371 (c)(1),
(2), (4) Date: May 4, 2006

(87) PCT Pub. No.: WO2005/045937

PCT Pub. Date: May 19, 2005

(65) Prior Publication Data

US 2007/0080379 A1    Apr. 12, 2007

(30) Foreign Application Priority Data

Nov. 6, 2003    (GB) ................................. 0326030.4

(51) Int. Cl.
H01L 29/78 (2006.01)
H01L 29/41 (2006.01)
H01L 29/739 (2006.01)
(52) U.S. Cl. ............... 257/340; 257/365; 257/366; 257/401; 257/409; 257/E23.114
(58) Field of Classification Search .......... 257/262, 257/319, 340, 365, 366, 401, 409, E23.114
See application file for complete search history.

(56) References Cited

U.S. PATENT DOCUMENTS 5,466,348 A * 11/1995 Holm-Kennedy ........... 257/253
5,973,360 A * 10/1999 Tihanyi ...................... 257/330
6,133,116 A * 10/2000 Kim et al. ................... 438/430
6,468,847 B1 * 10/2002 Disney ....................... 438/197
6,498,382 B2 * 12/2002 Hirler et al. ................ 257/510
6,534,830 B2 * 3/2003 Tihanyi et al. .............. 257/343
2002/0177277 A1 * 11/2002 Baliga ....................... 438/268
2003/0227052 A1 * 12/2003 Ono et al. .................. 257/341

FOREIGN PATENT DOCUMENTS

DE    100 07 415    9/2001

(Continued)

OTHER PUBLICATIONS

PCT International Search Report dated Jun. 24, 2005 for PCT/IB2004/052284.*

*Primary Examiner*—Zandra Smith
*Assistant Examiner*—Telly D Green (57) ABSTRACT

An insulated gate field effect transistor has a drain region (2,4), a body region (6) of opposite conductivity type and a source region (8) and an insulated gate (14) extending laterally over the body region (6), defining a channel region (30) extending in the body region (6) from a source end adjacent to the source region (8) to a drain end adjacent to a drain end part (26) of the drain region (4). A conductive shield plate (22) is provided adjacent to the drain end for shielding the gate. Embodiments include a shield plate extension (32) extending over the drain region from the shield plate (22) towards the gate (14).

13 Claims, 7 Drawing Sheets

FOREIGN PATENT DOCUMENTS

| | | | |
|---|---|---|---|
| DE | 10007415 A1 * | 9/2001 | |
| JP | 60-3887 * | 7/1985 | |
| JP | 60-38877 | 7/1985 | |
| JP | 05343691 A * | 12/1993 | |
| JP | 5-343691 | 3/1994 | |
| JP | 2003-298052 | 10/2003 | |
| WO | WO 97/35345 | 9/1997 | |

* cited by examiner

INSULATED GATE FIELD EFFECT TRANSISTOR

The invention relates to an insulated gate field effect transistor, and in particular to an insulated gate field effect transistor suitable for power applications.

A number of different types of insulated gate field effect transistors (IGFETs), generally MOSFETs (Metal Oxide Semiconductor Field Effect Transistors) are commonly used in a variety of applications.

For example, low-voltage MOSFETs are commonly used in voltage regulator modules (VRMs) in power supplies for electronic equipment such as personal computers. Commonly, a pair of MOSFETs are used, known as a Control FET and a Sync FET. The ideal characteristics of these FETs differ slightly. For the Sync FET the conduction power loss should be as low as possible. Since the conduction power loss is proportional to the specific on-resistance ($R_{ds,on}$), the resistance of the FET in the on-state for unit area, this parameter should be reduced. For the control FET on the other hand the switching loss should be minimised, which is proportional to the gate-drain charge density ($Q_{gd}$).

A figure of merit (FOM) has been defined as the multiple of $R_{ds,on}$ and $Q_{gd}$ to provide an indication of how suitable a transistor is in for use in VRMs. Note that the smaller the FOM the better.

Figure 1:
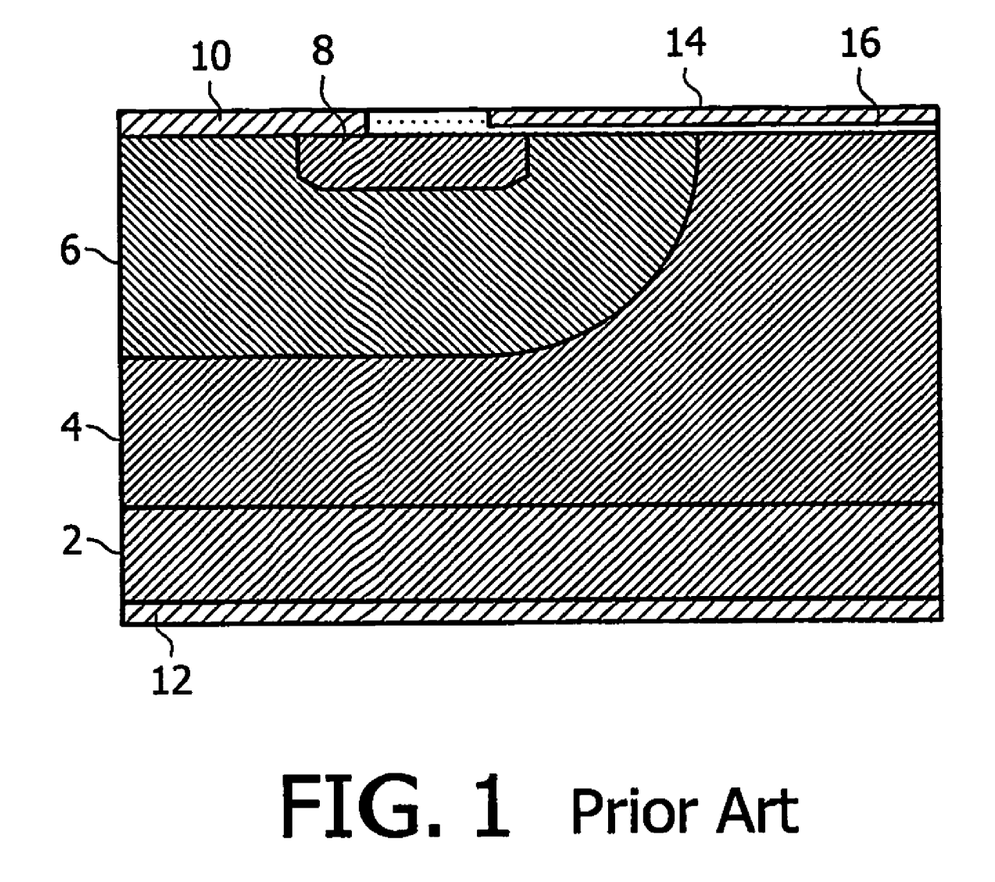
FIG. 1 shows a prior art planar DMOS structure.

FIG. 1 shows a side view of a prior art insulated gate field effect transistor, of the type known as Planar DMOS (Double-Diffused Metal Oxide Semiconductor). An n-type epilayer 4 is deposited on an n+ type substrate 2. A p-type body region 6 is diffused into the epilayer 4 at a top surface, and an n-type source region 8 diffused into the body. A source contact 10 contacts the source region 8 and body region 6, and a drain contact 12 contacts the rear of the substrate. A gate 14 extends across the body region 6 between source region 8 and epilayer 4 at the top surface, insulated from the semiconductor regions by a thin gate insulator 16.

An alternative prior art insulated gate field effect transistor is a trench field effect transistor (Trench FET) in which the gate is in a vertical insulated trench extending from the source region to the drain rather than extending horizontally across the surface.

When DMOS technology is compared with Trench FET technology it is known that well-optimised DMOS technology generally exhibits quicker switching and lower losses. This is true even though the FOM of typical DMOS transistors may be higher, and hence worse, than the FOM of trench transistors.

It would therefore be beneficial to provide an improved DMOS structure.

According to the invention there is provided an insulated gate field effect transistor, comprising:

a semiconductor body defining opposed first and second major surfaces;

a drain region of a first conductivity type extending vertically between the second major surface and part of the first major surface;

a body region of a second conductivity type opposite to the first conductivity type extending from the first major surface to a body depth;

a source region of the first conductivity type adjacent to the body region at the first major surface;

a source contact contacting the source region and a drain contact contacting the drain region; and an insulated gate extending laterally over the first major surface over the body region, defining a channel region extending in the body region from a source end adjacent to the source region to a drain end adjacent to a drain end part of the drain region, further comprising:

a conductive shield plate for shielding the gate, extending in an insulated trench from the first major surface towards the second major surface, the conductive shield plate being separated from the body region by part of the drain region including the channel end part of the drain region.

Note that the channel end part of the drain region has physical significance since when the device is on a conductive channel forms at the first major surface of the channel region and carriers from the source pass through the channel and arrive in the drift region at the channel end part. The carriers pass to the drain contact from here by passing through that part of the drain region that lies between the body region and the shield plate.

When the transistor is switched between an off state, with for example 12V between source and drain (the drain-source voltage or Vds), and an on state, with for example 0.1V between source and drain, a significant amount of charge flows, which will be referred to in this specification as the capacitative current. The capacitative current is a current flowing between drain and source when Vds changes. The shield plate in combination with the depletion region between the body plate and the drain region directs more of this capacitative current to flow into the source region, away from the gate, as compared with conventional planar DMOS devices without a shield plate. By directing the current in this way the capacitance between drain and source (Cds) increases and the capacitance between gate and drain (Cgd) decreases.

The relationship between gate voltage V, time t, the gate-drain capacitance Cgd and a constant Ig is given by the equation dV/dt=Ig/Cgd. Since Ig is a constant, the reduced Cgd results in a faster change of voltage, i.e. an improved switching time. Since Vds.Ids (where Ids is the drain-source current) is the power loss, the total energy loss decreases because of the faster switching time and so the total power loss (i.e. the switching loss) is lower. Thus the shield plate reduces Cgd at the expense of Cds thereby increasing the rate of change of voltage leading to lower overall power losses.

Note that in the off state the distance between gate and the conductive (non-depleted) part of the drift region is significantly greater in this device than in conventional FETs such as those illustrated in FIG. 1.

There are a number of known semiconductor devices in which source-connected vertical field plates are used in a planar DMOS structure. WO 02/099909 describes one such arrangement, and U.S. Pat. No. 6,525,372 another. However, in these devices the field plate extends at the source end of the channel, rather than the drain end. Accordingly, although the field plate in such prior art devices may be able to deplete, at least partially, a low-doped drift region under the body region, it is not effective in providing local shielding to the gate, particularly the end part of the gate above the channel end.

Indeed, in such prior devices, the field plates need to deplete the complete drift region between them, including the full length of the channel of the device. In the specific examples mentioned above, two complete transistors are provided between the field plates and so the gap between field plates is well over double the channel length of any single device. To deplete the drift region over such a large distance between field plates requires that the doping in the drift region is low. In contrast, in the present invention, the shield plate and body only need to cooperate to deplete the drain region in the gap between the body and the shield plate. This can be much narrower, and accordingly the doping density in this drain region can be higher than in the drift region of the prior art devices.

To further improve the shielding the gate preferably extends for as short a distance as possible over the drain region. Accordingly, the gate preferably extends for no more than 0.6 micron over the drain region, preferably no more than 0.4 micron.

In a preferred embodiment, a conductive shield plate extension is connected to the shield plate extending laterally over the first major surface of the drain region from the shield plate towards the channel end part of the drain region, the shield plate extension being separated by insulator from the drain region.

In this way, the shielding effect of the shield plate can be maximised whilst still allowing a sufficient gap between shield plate and body to allow current to flow without excessive resistance in the on state.

In a preferred embodiment, a single gate insulator layer extends under both the gate and the shield plate extension.

The lateral gap between source plate extension and gate may be small, in preferred embodiments in the range 0.05 micron and 0.2 micron.

The gap between shield plate and body region is preferably larger, to allow current to flow. Accordingly, the gap between the shield plate trench and the body region is preferably between 0.2 and 5 microns, preferably 0.4 and 2 microns. The chosen gap will depend on the required breakdown voltage. For a breakdown voltage of 25V only a small gap is required, for example in the range 0.2 to 0.6 micron, but for a higher breakdown voltage, for example 200V, a bigger gap, for example between 1.5 and 5 microns may be used. This is because the body/drain depletion will be larger for higher breakdown voltages, so to reduce current pinching as the current spreads from the body to drain a wider gap is required at higher breakdown voltages.

The shield plate may conveniently be connected to the source.

The shield plate preferably extends to a similar depth to the body region in order to cooperate effectively with the body region in shielding the gate. Accordingly, in preferred embodiments the depth of the shield plate trench is between 50% and 200% (preferably 80% to 120%) of the body depth of the body region.

Conveniently, the first conductivity type is n-type, the second conductivity type is p-type, and the shield plate is p-type doped polysilicon.

Alternatively, an n-type body, p-type source and drain, and n-doped polysilicon in the trench may be used.

The invention is not just applicable to conventional MOSFETs, but also to insulated gate bipolar transistors (IGBTs) for which the same issue of shielding the gate arises. In this case, the terms used in the present specification of "drain", "source" and "body" region may be interpreted as meaning collector region, emitter region and base region respectively.

For a better understanding of the invention, embodiments will now be described, purely by way of example, with reference to the accompanying drawings, in which.

For ease of understanding, like or similar components are given like reference numerals in different embodiments. The figures are diagrammatic and not to scale.

Figure 2:
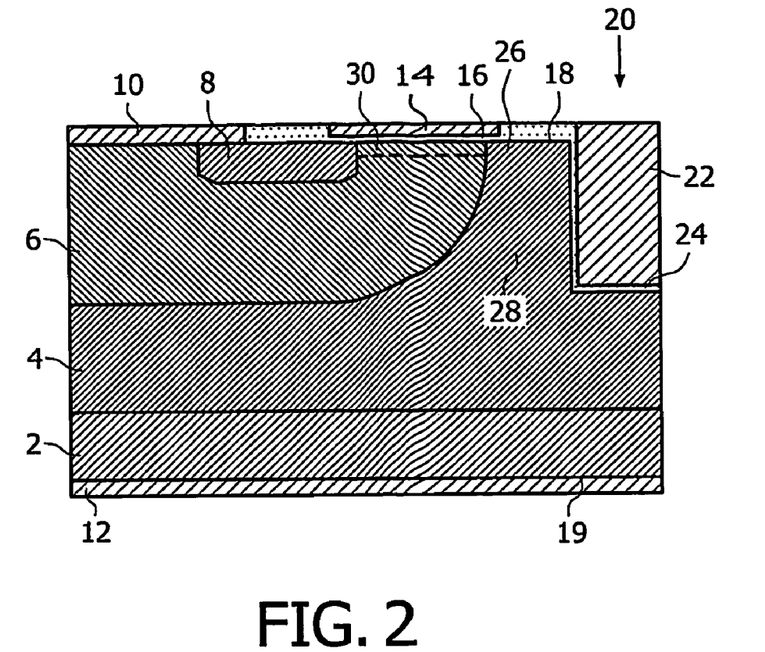
FIG. 2 shows a first embodiment of a planar DMOS structure according to the invention.

Referring to FIG. 2, an n-type epilayer 4 is provided above an n+ type substrate 2. The epilayer and the substrate together constitute an n-type drain region that extends between the first major surface 18 and the second major surface 19. A drain contact 12 is provided on the second major surface 19 connecting to the n+ type substrate 2.

A p-type body region 6 is provided at part of the first major surface 18, and an n-type source region 8 is provided at part of the first major surface. An ohmic contact 10 is provided connecting to the source and also the body region.

A gate 14 is provided above the first major surface 18, extending from over the source region, over the body region 6 to over the drain region. The gate is insulated from the source region 8, body region 6 and drain region 2, 4 by a gate insulator 16. In use, the gate 14 induces a channel 30 between source region 8 and drain region 2, 4 and carriers, in this case electrons, pass from the source region into the drain region through the channel 30. The carriers arrive at the channel end part of the drain region 26, adjacent to the body region 6.

Unlike the prior art arrangement illustrated in FIG. 1, an insulated trench 20 is provided adjacent to the channel end part 26 of the drain region. The trench 20 extends from the first major surface towards the second major surface to a depth of 1 micron, matching the body depth of the body region which is also 1 micron in this example.

The trench contains a field plate 22 of conductive p-type doped polysilicon insulated from the drain region 2, 4 by trench insulator 24.

The manufacture of the device may be carried out using techniques known to those skilled in the art, and so will not be described further. In particular, the device may be manufactured using double diffused MOS (DMOS) technology, or vertical DMOS (VDMOS) technology.

When the device is switched on, the current flows from the source region 8 through channel 30 into the channel end part 26 of the drain region, and then through the gap 28 between the trench 20 and the body region 6 to eventually arrive at the drain contact 12. The shield plate 22 shields the end of the gate 14 from the drain when the device is switched off. It does this by depleting the gap 28 between the body region 6 and the shield plate 22. This gap can be quite small and accordingly the doping in the epilayer 4 can be reasonably high and still obtain depletion of this gap region 28. The large distance between the gate and the conductive, non-depleted, part of the drain region 4 compared with the arrangement shown in FIG. 1 means that the gate-drain capacitance is small and this means that the charge that needs to be moved when switching the device between on and off state is much smaller than in the prior device represented by FIG. 1. This improves switching performance and indeed switching speed.

Figure 3:
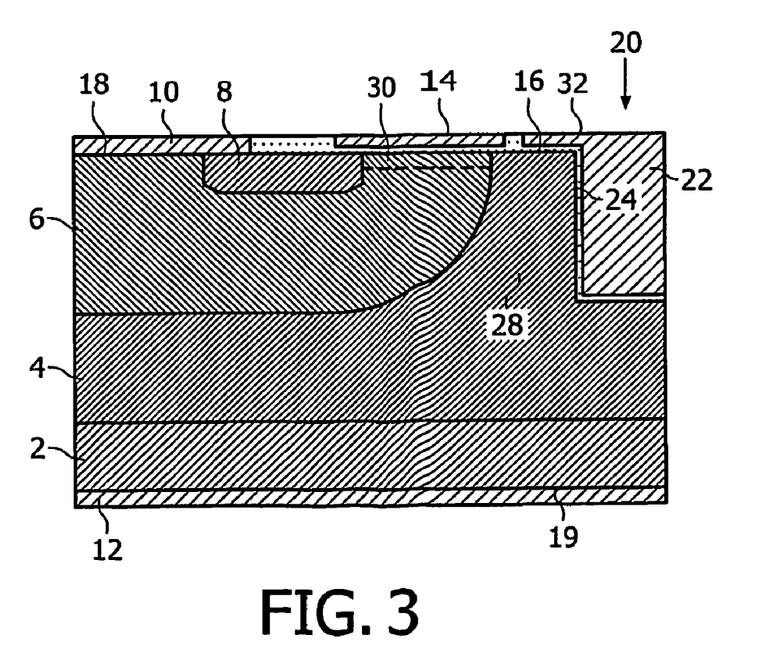
FIG. 3 shows a second embodiment of a planar DMOS structure according to the invention.

FIG. 3 shows a second embodiment which is the same as the embodiment of FIG. 2 except that the shield plate 22 has a lateral shield plate extension 32 extending towards the gate 14 above the first major surface 18. For manufacturing convenience, the same gate insulator 16 extends laterally under both the gate 14 and the shield plate extension 32 to insulate the shield plate extension from drift region 2, 4.

Comparative calculations were made for the prior art device of FIG. 1 and the device of FIG. 3.

Figure 4:
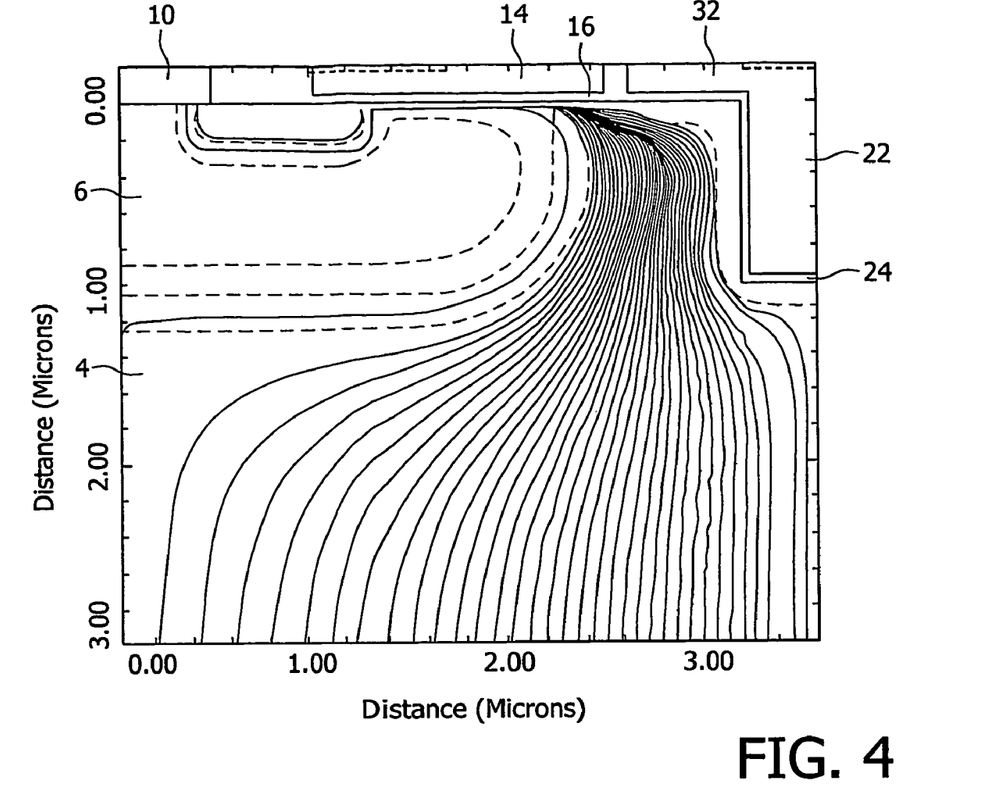
FIG. 4 shows calculated current flow lines in the second embodiment.

FIG. 4 shows the calculated current flow lines for the device of FIG. 3 in the on state. Note that the crowding of the flow lines at the channel end part 26 of the drain region does increase the resistance slightly over prior art arrangements.

Figure 5:
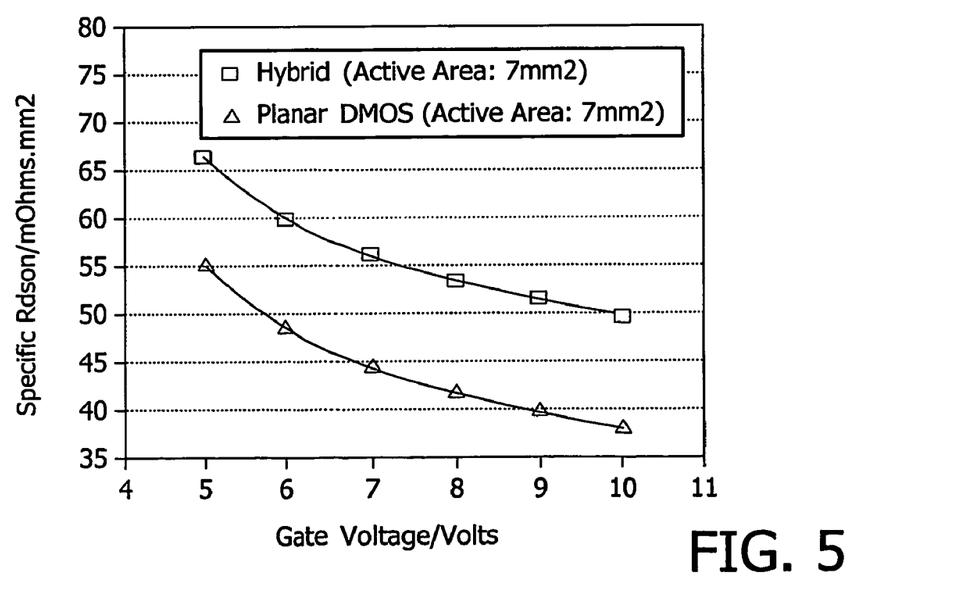
FIG. 5 shows calculated specific $R_{ds\_on}$ values in the second embodiment and in a comparative prior art structure.

This may be seen in the graph of FIG. 5 which shows the specific Rds.on for the device according to FIG. 3 (square points) and the prior art device (triangular points). Although the device according to the invention exhibits a slightly worse on-resistance it should be noted that the $R_{ds.on}$ value at 10 volts is highly satisfactory for this type of device.

Figure 6:
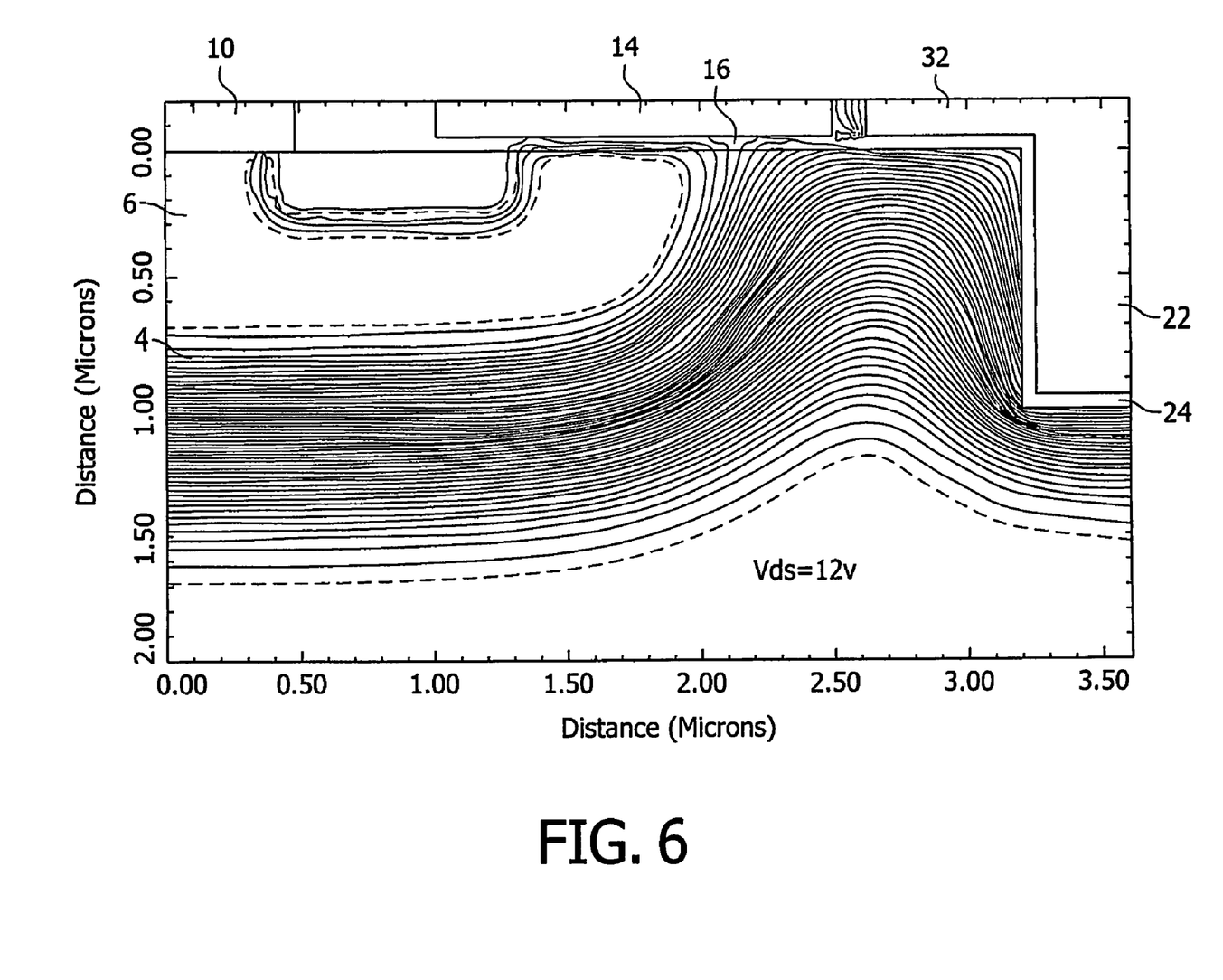
FIG. 6 shows the potential and depletion contours in the second embodiment for a Vds of 12V.
Figure 7:
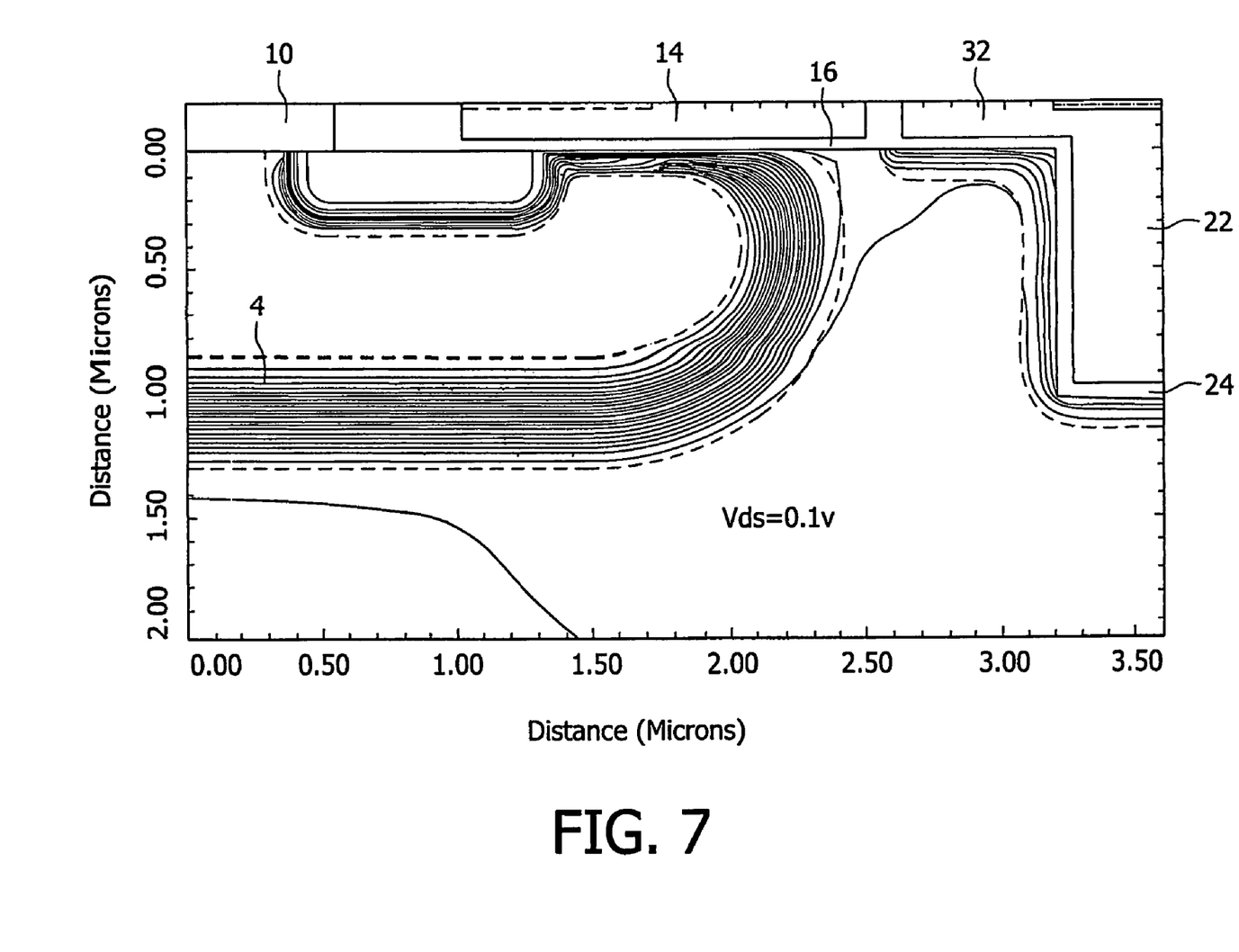
FIG. 7 shows the potential and depletion contours in the second embodiment for a Vds of 0.1V.

FIG. 6 shows the potential lines and depletion boundary for a drain-source voltage of 12 volts, and FIG. 7 shows the potential lines and depletion boundary for a drain source voltage of 0.1 volts.

Note from FIG. 6 that the gap 28 between the body layer 6 and the shield plate 22 is fully depleted. This means that the capacitance between the drain and the gate is significantly reduced.

Figure 8:
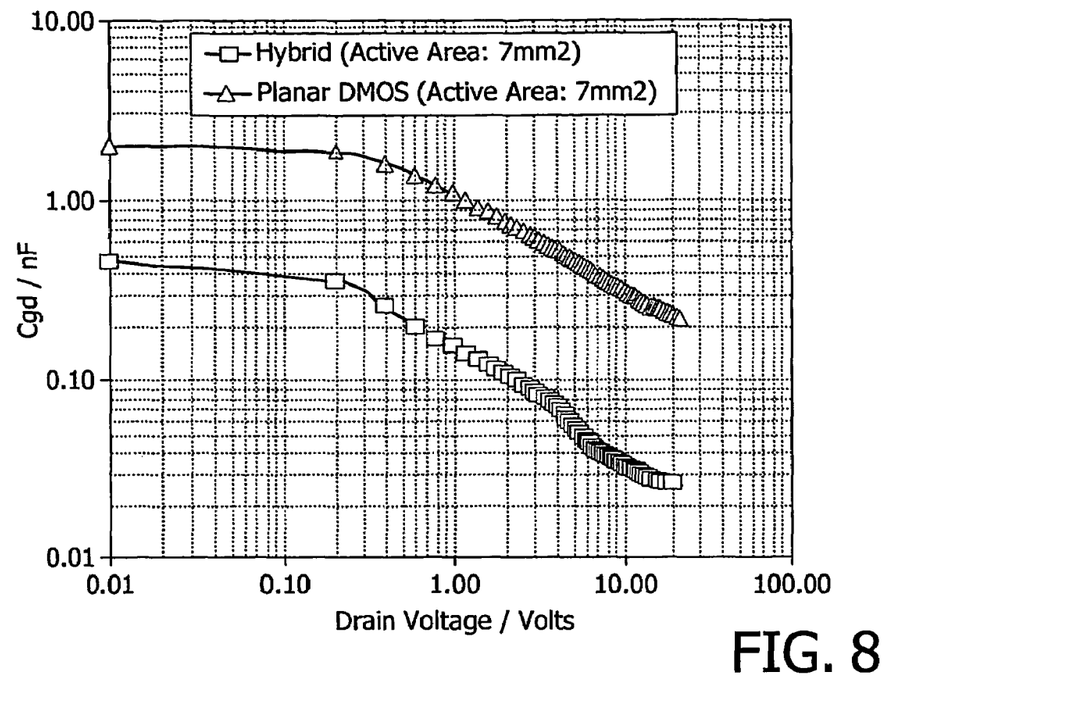
FIG. 8 shows calculated $C_{gd}$ values in the second embodiment and in a comparative prior art structure.

Values for this capacitance $C_{gd}$ have a function of drain voltage are presented in FIG. 8. Again, calculated results for the device according to the present invention are plotted using square points and results for the prior art with triangular points. Note the significantly improved capacitance values obtained using the present invention.

Figure 9:
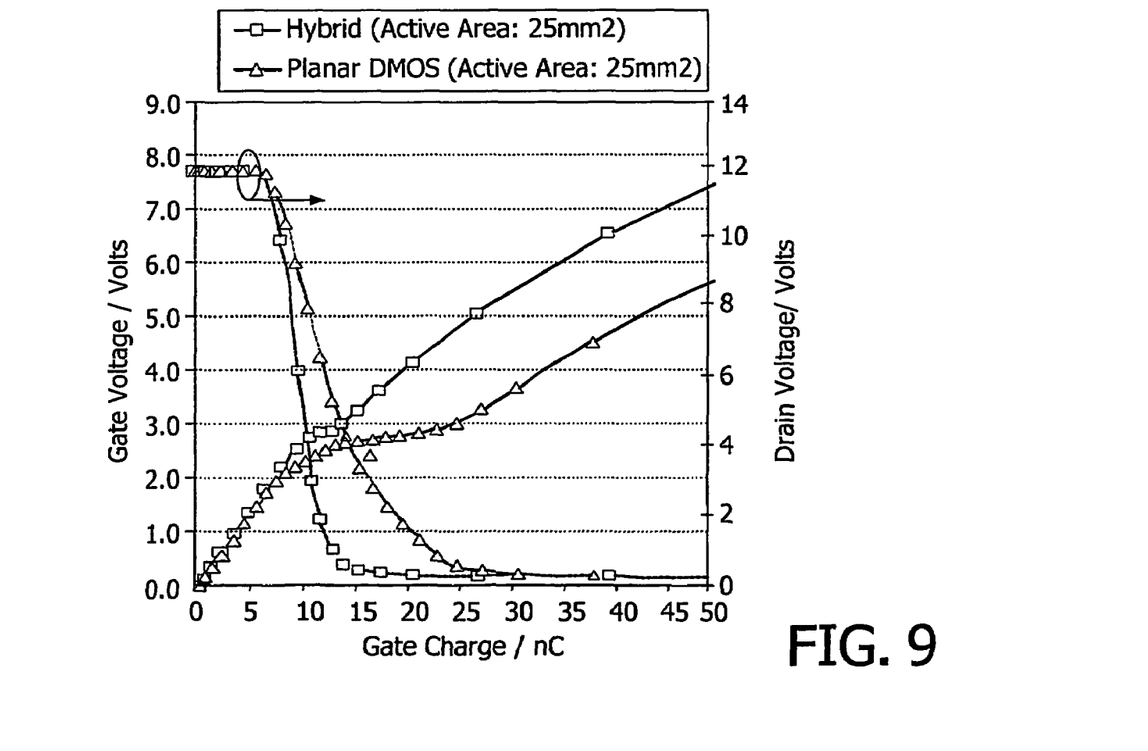
FIG. 9 shows calculated switching performance in the second embodiment and in a comparative prior art structure.

FIG. 9 shows the simulated switching performance for these devices. This is really where the present invention is beneficial.

Figure 10:
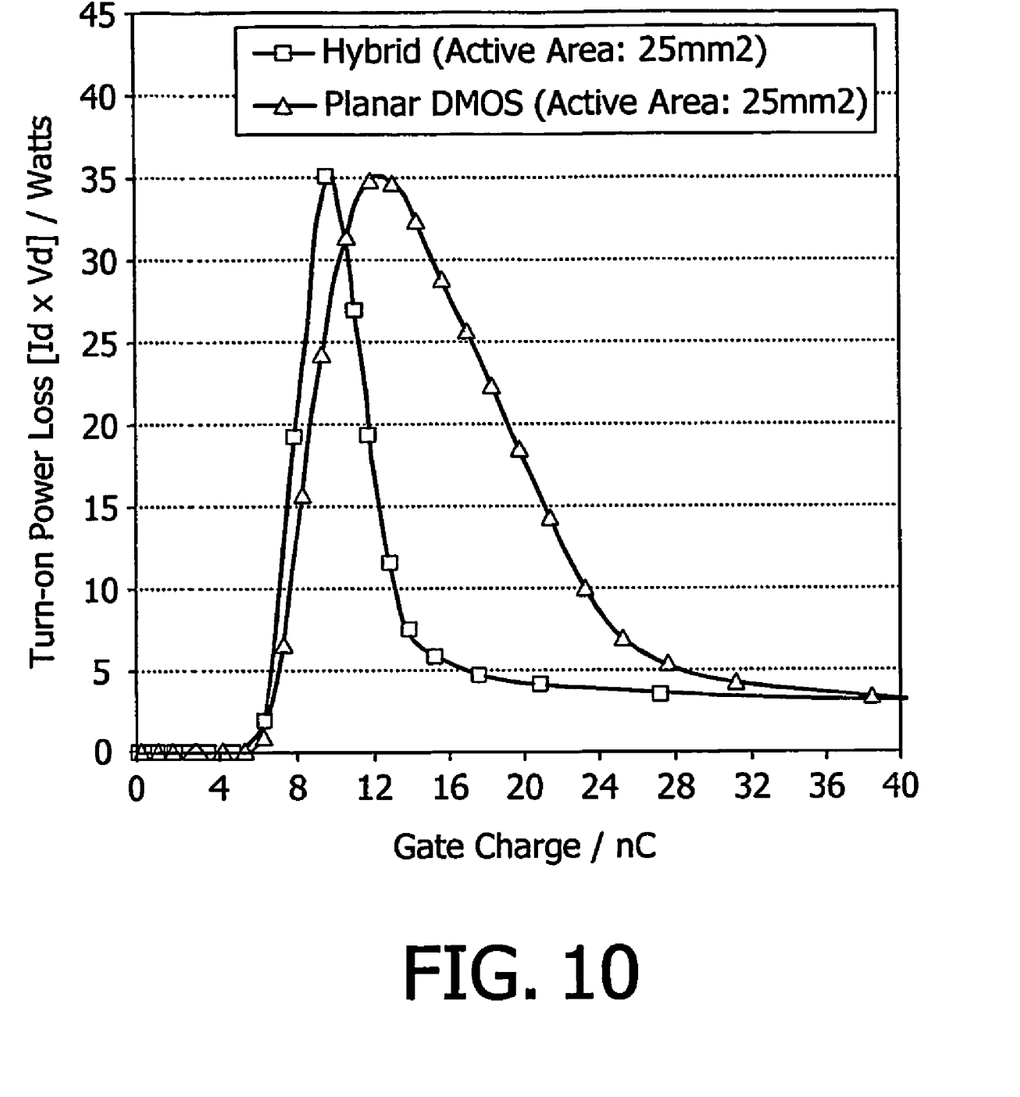
FIG. 10 illustrates calculated switching losses in the second embodiment and in a comparative prior art structure.

FIG. 10 shows the simulated turn-on switching losses for both the present and the prior art device.

Both of these graphs are plotted against gate charge or Qd. Since Qd=Ig.t, where t is the time, and Ig is essentially a constant, these graphs effectively show gate voltage and drain voltage (FIG. 9) and power loss (FIG. 10) against time.

Integrating up the graph of FIG. 10, the switching losses have been reduced by about 60% compared with the conventional structure. This is highly beneficial.

The FOM of the present structure is 5.7 mOhms.nC, compared with the prior art structure of 21.9 mOhms.nC. This is a very considerable improvement in this planar DMOS structure with fast switching times.

From reading the present disclosure, other variations and modifications will be apparent to persons skilled in the art. Such variations and modifications may involve equivalent and other features which are already known in the design, manufacture and use of semiconductor devices, especially DMOS, VDMOS and IGBT devices and which may be used in addition to or instead of features described herein. Although claims have been formulated in this application to particular combinations of features, it should be understood that the scope of disclosure also includes any novel feature or any novel combination of features disclosed herein either explicitly or implicitly or any generalisation thereof, whether or not it mitigates any or all of the same technical problems as does the present invention. The applicants hereby give notice that new claims may be formulated to any such features and/or combinations of such features during the prosecution of the present application or of any further applications derived therefrom.

The invention claimed is:

1. An insulated gate field effect transistor, comprising:
a semiconductor body defining opposed first and second major surfaces;
a drain region of a first conductivity type extending vertically between the second major surface and part of the first major surface;
a body region of a second conductivity type opposite to the first conductivity type extending from the first major surface to a body depth;
a source region of the first conductivity type adjacent to the body region at the first major surface;
a source contact contacting the source region and a drain contact contacting the drain region;
an insulated gate extending laterally over the first major surface over the body region, defining a channel region extending in the body region from a source end adjacent to the source region to a drain end adjacent to a channel end part of the drain region;
a conductive shield plate for shielding the gate, extending in an insulated trench from the first major surface towards the second major surface, the conductive shield plate being separated from the body region by part of the drain region including the channel end part of the drain region and the conductive shield plate being electrically connected to the source region; and
a conductive shield plate extension connected to the shield plate extending laterally over the first major surface of the drain region from the shield plate towards the channel end part of the drain region, the shield plate extension being separated by insulator from the drain region.

2. An insulated gate field effect transistor according to claim 1, wherein a gate insulator layer extends under both the gate and the shield plate extension.

3. An insulated gate field effect transistor according to claim 1, wherein the lateral gap between the shield plate extension and the gate is in the range of about 0.05 to about 0.2 microns.

4. An insulated gate field effect transistor according to claim 1, wherein the shield plate trench extends to a depth that is substantially equal to the body depth.

5. An insulated gate field effect transistor according to claim 1, wherein the depth of the shield plate trench is between about 50% and about 200% of the depth of the body region.

6. An insulated gate field effect transistor according to claim 1, wherein the first conductivity type is n-type, the second conductivity type is p-type, and the shield plate is of p-type doped polysilicon.

7. An insulated gate field effect transistor according to any preceding claim, wherein the lateral gap between the shield plate trench and the body region is between about 0.5 and about 2 microns.

8. An insulated gate field effect transistor according to claim 1, wherein the gate extends over the channel end part of the drift region by no more than about 0.4 microns.

9. An insulated gate field effect transistor, comprising:
a semiconductor body defining opposed first and second major surfaces;
a drain region of a first conductivity type extending vertically between the second major surface and part of the first major surface;
a body region of a second conductivity type opposite to the first conductivity type extending from the first major surface to a body depth;
a source region of the first conductivity type adjacent to the body region at the first major surface;
a source contact contacting the source region and a drain contact contacting the drain region,
an insulated gate extending laterally over the first major surface over the body region and over the channel end part of the drift region by no more than about 0.4 microns, defining a channel region extending in the body region from a source end adjacent to the source region to a drain end adjacent to a channel end part of the drain region, and a conductive shield plate for shielding the gate, extending in an insulated trench from the first major surface towards the second major surface, the conductive shield plate being separated from the body region by part of the drain region including the channel end part of the drain region.

10. An insulated gate field effect transistor according to claim 9, further comprising:

a conductive shield plate extension connected to the shield plate extending laterally over the first major surface of the drain region from the shield plate towards the channel end part of the drain region, the shield plate extension being separated by insulator from the drain region.

11. An insulated gate field effect transistor according to claim 9, wherein the shield plate trench extends to a depth that is substantially equal to the body depth.

12. An insulated gate field effect transistor, comprising:

a semiconductor body defining opposed first and second major surfaces;

a drain region of a first conductivity type extending vertically between the second major surface and part of the first major surface;

a body region of a second conductivity type opposite to the first conductivity type extending from the first major surface to a body depth;

a source region of the first conductivity type adjacent to the body region at the first major surface;

a source contact contacting the source region and a drain contact contacting the drain region, an insulated gate extending laterally over the first major surface over the body region, defining a channel region extending in the body region from a source end adjacent to the source region to a drain end adjacent to a channel end part of the drain region, and a conductive shield plate for shielding the gate, extending in an insulated trench from the first major surface towards the second major or surface, the conductive shield plate being separated from the body region by part of the drain region including the channel end part of the drain region, the depth of the shield plate trench being between about 50% and about 200% of the depth of the body region.

13. An insulated gate field effect transistor according to claim 12, further comprising:

a conductive shield plate extension connected to the shield plate extending laterally over the first major surface of the drain region from the shield plate towards the channel end part of the drain region, the shield plate extension being separated by insulator from the drain region.

* * * * *